US009646792B2

(12) United States Patent
Kim

(10) Patent No.: US 9,646,792 B2
(45) Date of Patent: May 9, 2017

(54) GAP ADJUSTING METHOD IN TRIP MECHANISM OF MOLDED CASE CIRCUIT BREAKER

(71) Applicant: LSIS CO., LTD., Anyang-si, Gyeonggi-do (KR)

(72) Inventor: Woong Jae Kim, Cheongju-si (KR)

(73) Assignee: LSIS CO., LTD., Anyang-si (KR)

( * ) Notice: Subject to any disclaimer, the term of this patent is extended or adjusted under 35 U.S.C. 154(b) by 208 days.

(21) Appl. No.: 14/468,749

(22) Filed: Aug. 26, 2014

(65) Prior Publication Data

US 2015/0107091 A1 Apr. 23, 2015

(30) Foreign Application Priority Data

Oct. 17, 2013 (KR) ........................ 10-2013-0124172

(51) Int. Cl.
*G01R 31/28* (2006.01)
*H01H 69/01* (2006.01)
(Continued)

(52) U.S. Cl.
CPC ............. *H01H 69/01* (2013.01); *H01H 71/16* (2013.01); *H01H 71/522* (2013.01); *Y10T 29/49004* (2015.01)

(58) Field of Classification Search
CPC ............. H01H 69/01; H01H 2069/013; H01H 2069/016; H01H 71/522; H01H 71/16; Y10T 29/49004; Y10T 29/49002
(Continued)

(56) References Cited

U.S. PATENT DOCUMENTS 5,027,093 A 6/1991 Palmer et al.
7,859,369 B2 * 12/2010 Lias ...................... H01H 69/01 335/42
(Continued)

FOREIGN PATENT DOCUMENTS

CN 85107902 5/1987
CN 101364509 2/2009
(Continued)

OTHER PUBLICATIONS

Japan Patent Office Application Serial No. 2014-184045, Notice of Allowance dated Oct. 20, 2015, 3 pages.
(Continued)

*Primary Examiner* — Peter DungBa Vo
*Assistant Examiner* — Azm Parvez
(74) *Attorney, Agent, or Firm* — Lee, Hong, Degerman, Kang & Waimey

(57) ABSTRACT

Disclosed is a gap adjusting method which easily adjusts a gap between a bimetal and a crossbar by using a gap adjusting block and an adjusting screw in a trip mechanism of a molded case circuit breaker without a separate additional device. The gap adjusting method in the trip mechanism of the molded case circuit breaker includes setting a reference gap between a crossbar and a bimetal, measuring a total resistance of the trip mechanism and a trip stroke of a switching mechanism to set a compensation gap, placing a gap adjusting block on a position separated from a crossbar by a gap based on the sum of the reference gap and the compensation gap, rotating an adjusting screw assembled with the bimetal to contact the adjusting screw with the gap adjusting block, and adhering the adjusting screw to the bimetal.

5 Claims, 15 Drawing Sheets

(51) Int. Cl.
*H01H 71/16* (2006.01)
*H01H 71/52* (2006.01)

(58) Field of Classification Search
USPC .................................................. 29/593, 592.1
See application file for complete search history.

(56) References Cited

U.S. PATENT DOCUMENTS

| | | | | |
|---|---|---|---|---|
| 2009/0302978 | A1 | 12/2009 | Lias et al. | |
| 2012/0324715 | A1* | 12/2012 | Kim | H01H 69/01<br>29/593 |
| 2012/0325633 | A1* | 12/2012 | Kim | H01H 69/01<br>200/336 |

FOREIGN PATENT DOCUMENTS

| | | |
|---|---|---|
| CN | 102842464 | 12/2012 |
| EP | 2538430 | 12/2012 |
| JP | 60-30028 | 2/1985 |
| JP | 62-150853 | 9/1987 |
| JP | 03-030228 | 2/1991 |
| JP | 6-21140 | 3/1994 |
| JP | 07-192597 | 7/1995 |
| JP | 09-063449 | 3/1997 |
| JP | 2002-324473 | 11/2002 |
| JP | 2013-008676 | 1/2013 |
| KR | 20130001060 | 1/2013 |

OTHER PUBLICATIONS

Japan Patent Office Application Serial No. 2014-184045, Office Action dated Jun. 23, 2015, 3 pages.

The State Intellectual Property Office of the People's Republic of China Application No. 201410550726.2, Office Action dated Apr. 5, 2016, 5 pages.

Korean Intellectual Property Office Application No. 10-2013-0124172, Office Action dated Dec. 6, 2016, 5 pages.

European Patent Office Application Serial No. 14188245.6, Search Report dated Feb. 18, 2015, 4 pages.

* cited by examiner

GAP ADJUSTING METHOD IN TRIP MECHANISM OF MOLDED CASE CIRCUIT BREAKER

CROSS-REFERENCE TO RELATED APPLICATION

Pursuant to 35 U.S.C. §119(a), this application claims the benefit of earlier filing date and right of priority to Korean Application No. 10-2013-0124172, filed on Oct. 17, 2013, the contents of which are all hereby incorporated by reference herein in its entirety.

BACKGROUND OF THE DISCLOSURE

1. Field of the Disclosure

The present disclosure relates to a gap adjusting method in a trip mechanism of a molded case circuit breaker, and particularly, to a gap adjusting method which easily adjusts a gap between a bimetal and a crossbar by using a gap adjusting block and an adjusting screw in a trip mechanism of a molded case circuit breaker without a separate additional device, thereby enhancing a consistency of quality and assembly.

2. Background of the Disclosure

Generally, a molded case circuit breaker is mainly provided in a switchboard in power distribution equipment of a factory, a building, etc. In an unloaded state, the molded case circuit breaker acts as a switchgear that supplies or cuts off power to a load. In use of a load, when a high current exceeding a load current flows because an error occurs in a load electric circuit, the molded case circuit breaker acts as a circuit breaker that cuts off power supplied from a power source to the load so as to protect a power line of an electric circuit and elements of the load.

The molded case circuit breaker is formed in a structure where a switching mechanism, a trip mechanism, and an extinguishing device are coupled to each other in an external box formed of an insulating material. FIG. 1 illustrates a cross-sectional view of a related art molded case circuit breaker. The switching mechanism includes a power terminal 1 that is supplied with power, a fixed contactor 2 and a movable contactor 3 that transfer the power to a load, and a lever 4 that connects or disconnects the movable contactor 3 to or from the fixed contactor 2 to operate a circuit in a closed state or an open state. Also, the trip mechanism includes a heater 5 that detects an overcurrent, a bimetal 6 that is connected to the heater 5 and is bent by heat of the heater 5, and a crossbar 7 that binds the switching mechanism so as to maintain the closed state or the open state.

FIG. 2A is a front view of a related art trip mechanism, and FIG. 2B is a side view of the related art trip mechanism. Under an overload condition, the trip mechanism of the molded case circuit breaker detects an overload by using the bimetal 6 in which two members having different heat conductivities are bonded to each other, and breaks an electric circuit. When a high current flows like short circuit or ground, the trip mechanism breaks the electric circuit in a method using the principle of a magnet which instantaneously absorbs the high current to generate a magnetic field. Here, it is necessarily required to appropriately adjust a gap between the crossbar 7 and the bimetal 6, and in detail, a gap between the crossbar 7 and a rivet 8 coupled to the bimetal 6, so as to detect an overcurrent and appropriately break a power line.

FIG. 3 is a flowchart of a related art gap adjusting method, and FIG. 4 illustrates a gap adjusting operation.

The related art gap adjusting method will now be described. In a state where a circuit breaker is switched on, the rivet 8 assembled with the bimetal 6 is closely adhered to the crossbar 7 (FIG. 4A). The heater 5 generates heat when a predetermined overcurrent (a setting current) is applied to the circuit breaker, and the heat is conducted to the bimetal 6, whereby the bimetal 6 is bent. At this time, since the rivet 8 may freely move in a state of being assembled with the bimetal 6, the rivet 8 slides in a direction opposite to a bending direction of the bimetal 6, and maintains a state of being closely adhered to the crossbar 7 (FIG. 4B). After an overcurrent is applied and then a predetermined time (a setting time) elapses, the application of the overcurrent stops, and the rivet 8 is welded to the bimetal 6 by using a laser. Subsequently, the bimetal 6 is cooled to return to a normal state, and thus, a gap is formed between the crossbar 7 and the rivet 8 (FIG. 4C).

Here, a bending amount of the bimetal 6 is changed according to a current which is applied for gap adjustment. That is, as an applied current increases, a gap increases, and as the applied current decreases, the gap decreases. A setting of a setting current (i.e., an applied current) is determined by a trip stroke and trip load including an amount of invalid displacement in the switching mechanism of each product. Here, the trip stroke denotes a rotation distance from a position of the crossbar 7 in a normal state to a position in which the crossbar 7 rotates and thus the switching mechanism is released. Also, the trip load denotes a load which is applied to the crossbar 7 when the switching mechanism is tripped. The setting current is determined by measuring the trip stroke and trip load of the switching mechanism, and a gap suitable for the circuit breaker can be optimized by applying the setting current to the circuit breaker for a setting time.

In the related art, the heater 5 generates heat by applying a current, and the bimetal 6 is bent by the heat. A gap adjusting operation is performed in a state where the bimetal 6 is bent. A current several hundred times higher than a rated current of a product is applied within several seconds for performing the gap adjusting operation according to the standard, and for this reason, quality problems such as a color change of an element and an expansion of a load terminal caused by heat transfer occur.

Moreover, much cost for constant current test equipment for applying a current, laser welding equipment and a cooling device for fixing a rivet after a gap is adjusted, and facilities of the cooling device for restoring a bent bimetal after the gap is adjusted is expended, and maintenance cost is also expended.

When a change of a gap is needed due to a 4M change, it is difficult for a worker to easily change an amount of applied current or a time.

SUMMARY OF THE DISCLOSURE

Therefore, an aspect of the detailed description is to provide a gap adjusting method which easily adjusts a gap between a bimetal and a crossbar by using a gap adjusting block and an adjusting screw in a trip mechanism of a molded case circuit breaker.

Another aspect of the detailed description is to provide a gap adjusting method which decreases, as much as possible, the number of facilities used to adjust a gap between a bimetal and a crossbar, thereby reducing the installation cost and enabling maintenance.

To achieve these and other advantages and in accordance with the purpose of this specification, as embodied and broadly described herein, a gap adjusting method in a trip mechanism of a molded case circuit breaker includes: setting a reference gap between a crossbar and a bimetal; measuring a total resistance of the trip mechanism and a trip stroke of a switching mechanism to set a compensation gap; placing a gap adjusting block on a position separated from a crossbar by a gap based on a sum of the reference gap and the compensation gap; rotating an adjusting screw assembled with the bimetal to contact the adjusting screw with the gap adjusting block; and adhering the adjusting screw to the bimetal.

Here, a front end of the adjusting screw may be formed in a round shape or a plate shape.

Moreover, a rear end of the adjusting screw may be formed of one of a straight-shaped groove, a cross-shaped groove, a straight-shaped projection, and a cross-shaped projection.

According to the gap adjusting method in the trip mechanism of the molded case circuit breaker, a gap can be easily adjusted by using a gap adjusting block and an adjusting screw in the trip mechanism of the molded case circuit breaker.

Moreover, according to the gap adjusting method in the trip mechanism of the molded case circuit breaker, a gap adjusting process can be simplified.

Moreover, the number of additional devices necessary for gap adjustment in the trip mechanism is reduced, and thus, the cost of equipment is reduced.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Description will now be given in detail of the exemplary embodiments, with reference to the accompanying drawings. For the sake of brief description with reference to the drawings, the same or equivalent components will be provided with the same reference numbers, and description thereof will not be repeated.

Figure 1:
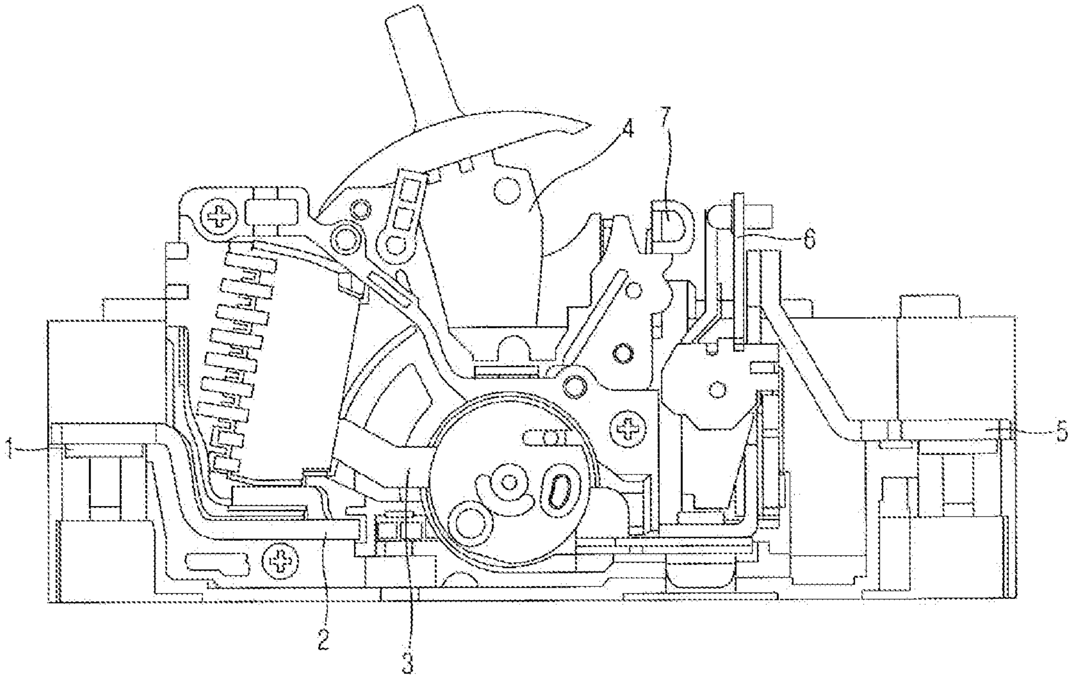
Fig. 1 PRIOR ART
FIG. 1 is a cross-sectional view of a related art molded case circuit breaker.
Figure 2A:
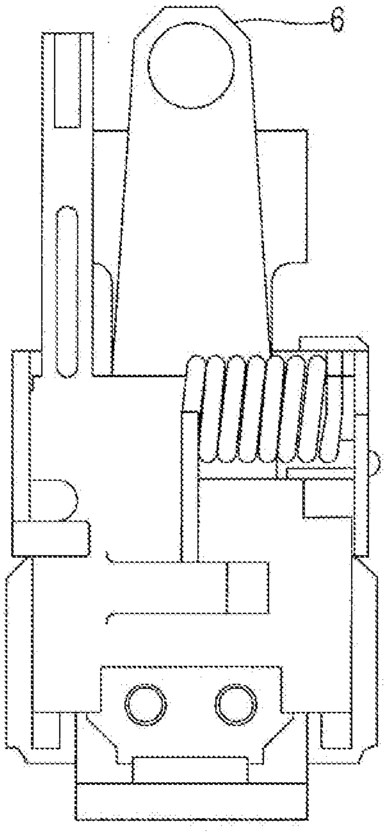
Fig. 2A PRIOR ART
FIG. 2A is a front view of a related art trip mechanism.
Figure 2B:
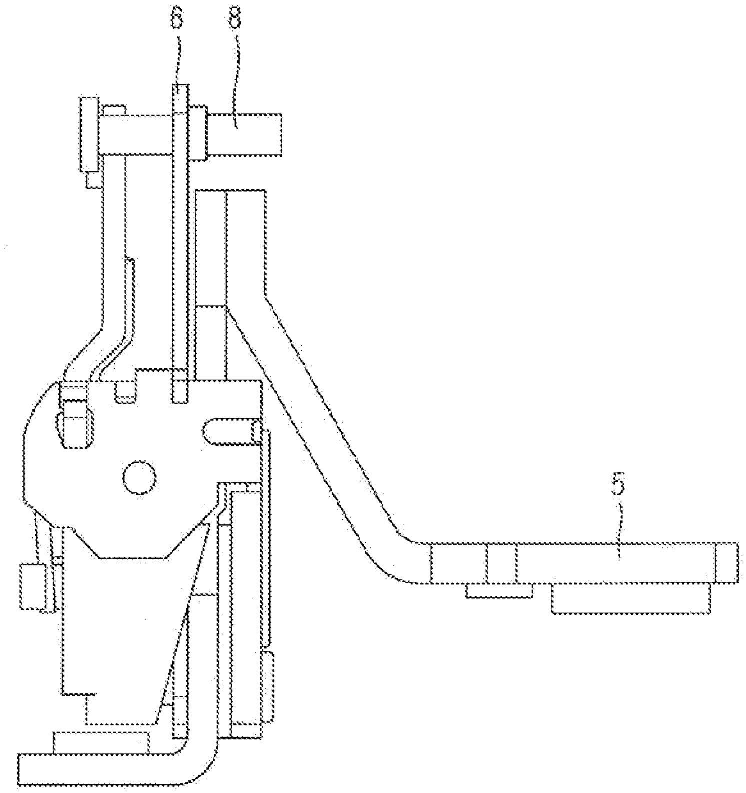
Fig. 2B PRIOR ART
FIG. 2B is a side view of the related art trip mechanism.
Figure 3:
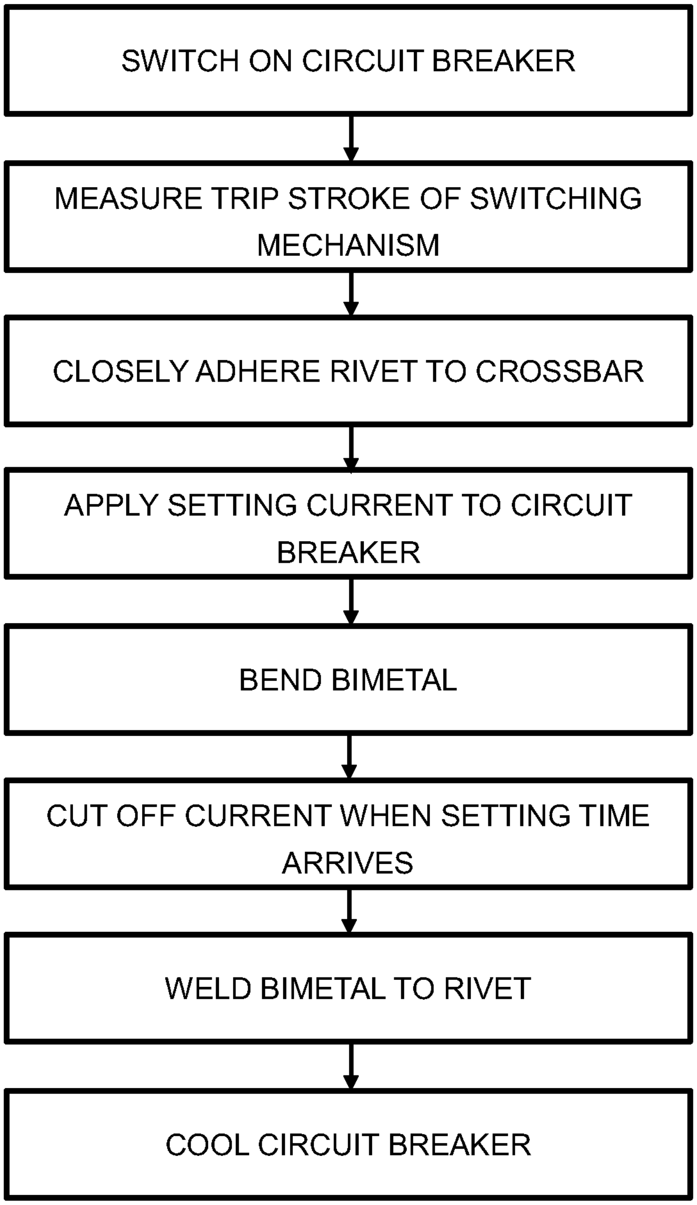
Fig. 3 PRIOR ART
FIG. 3 is a flowchart of a related art gap adjusting method.
Figure 4A:
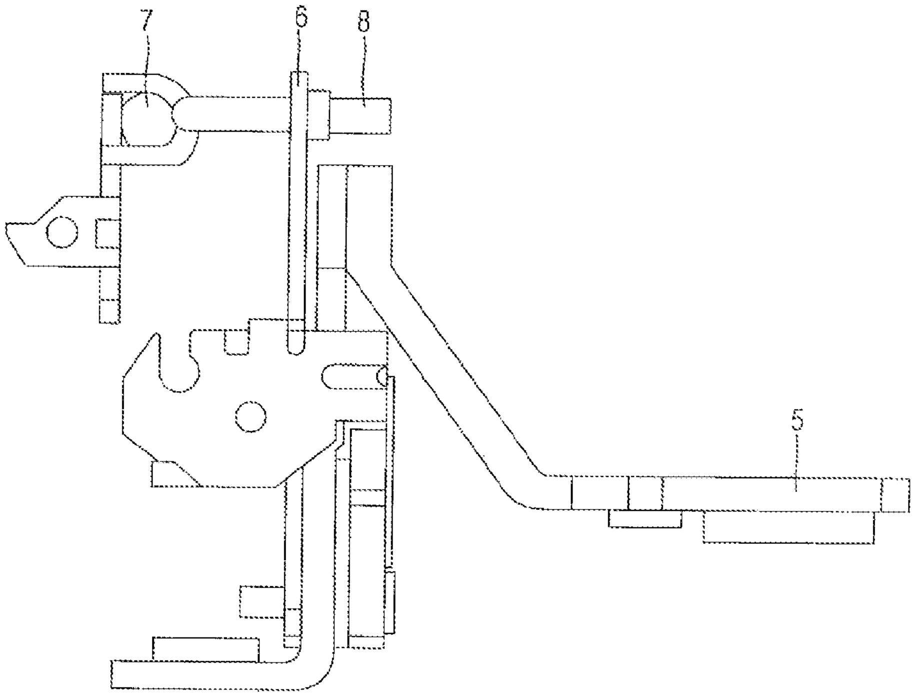
Fig. 4A PRIOR ART
FIGS. 4A, 4B and 4C are process views of a related art gap adjusting operation.
Figure 4B:
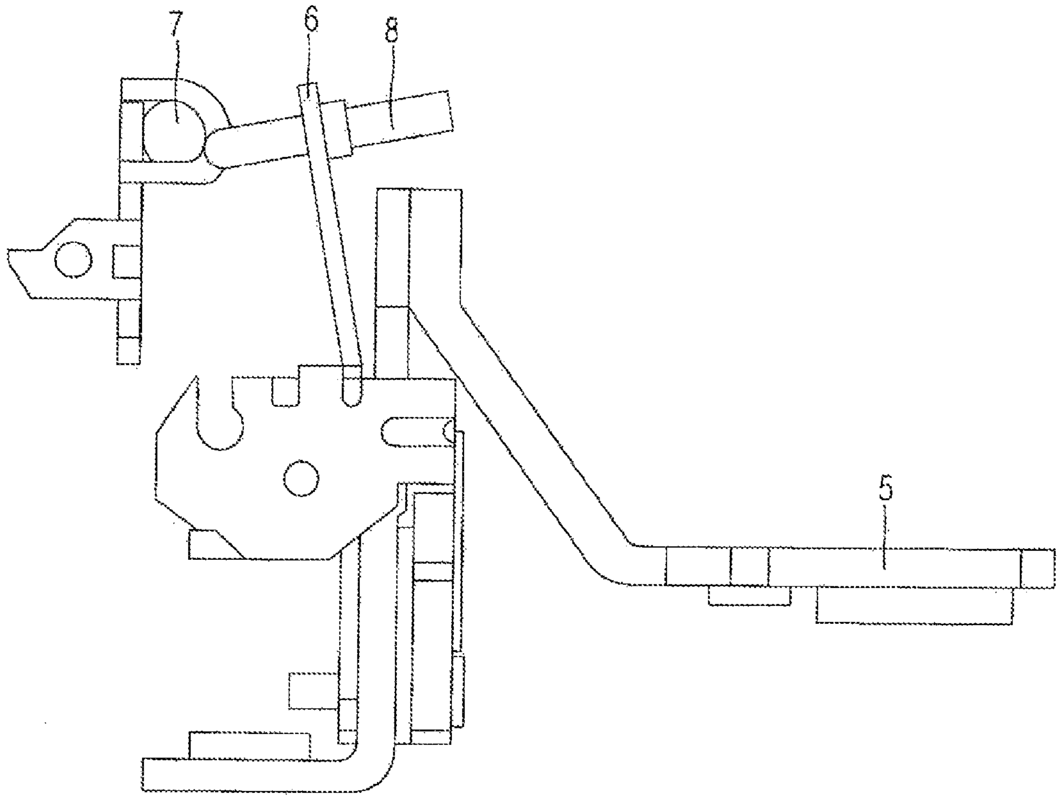
Fig. 4B PRIOR ART
Figure 4C:
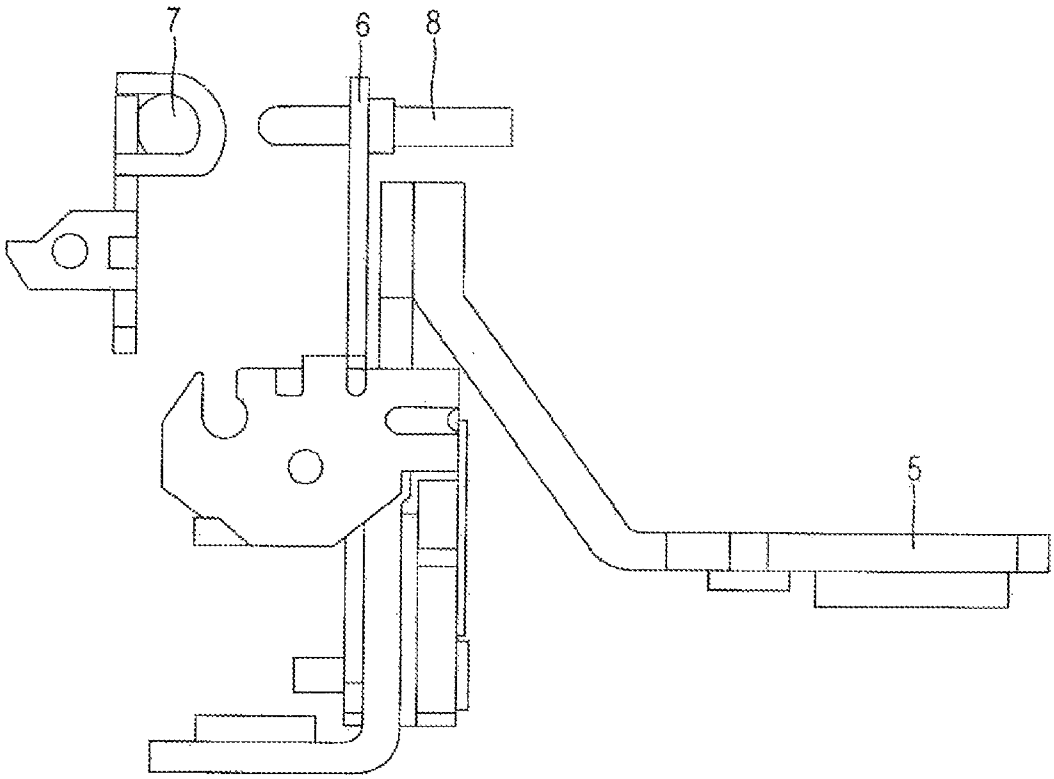
Fig. 4C PRIOR ART
Figure 5A:
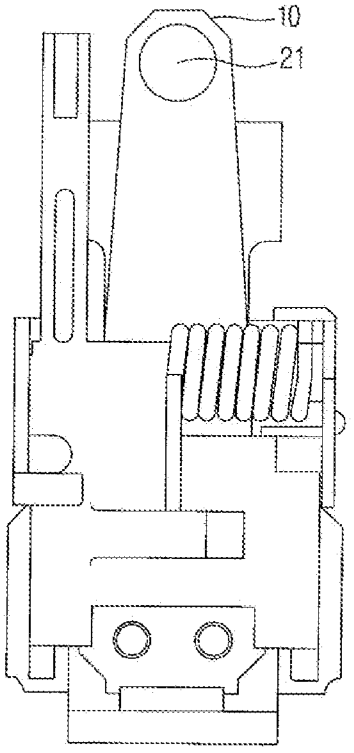
FIG. 5A is a partial front view of a trip mechanism according to an embodiment of the present invention.
Figure 5B:
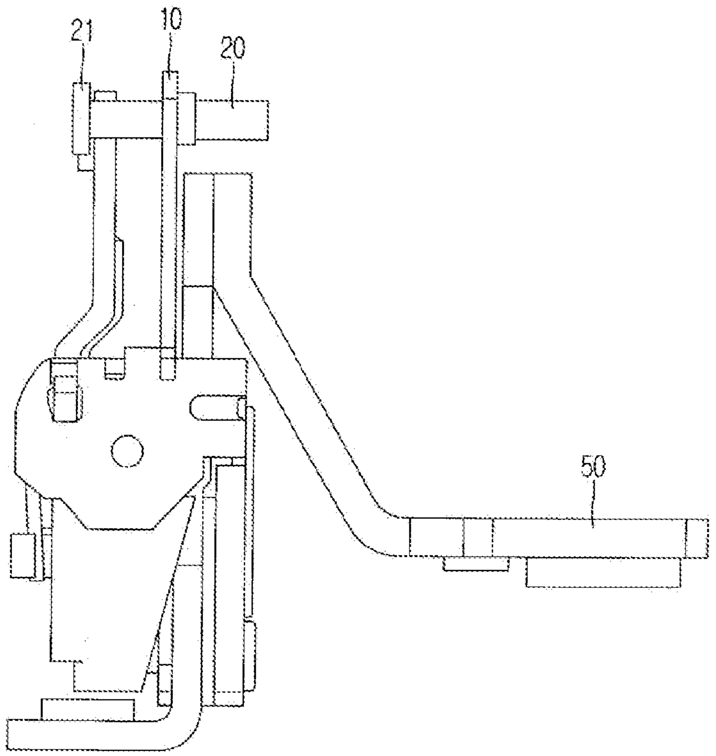
FIG. 5B is a partial side view of the trip mechanism according to an embodiment of the present invention.
Figure 6A:
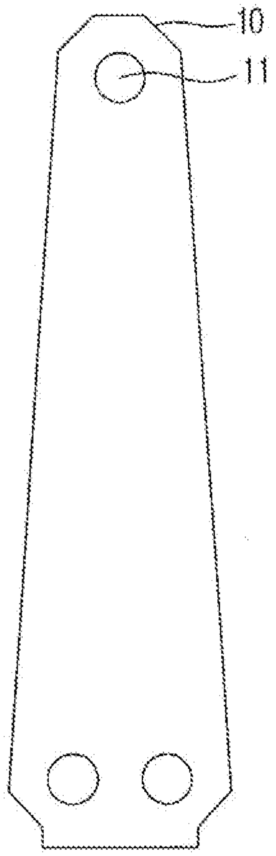
FIGS. 6A and 6B are front view and side view of a bimetal according to an embodiment of the present invention.
Figure 6B:
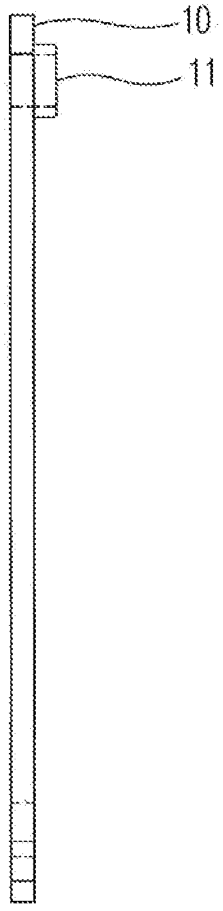
Figure 7A:
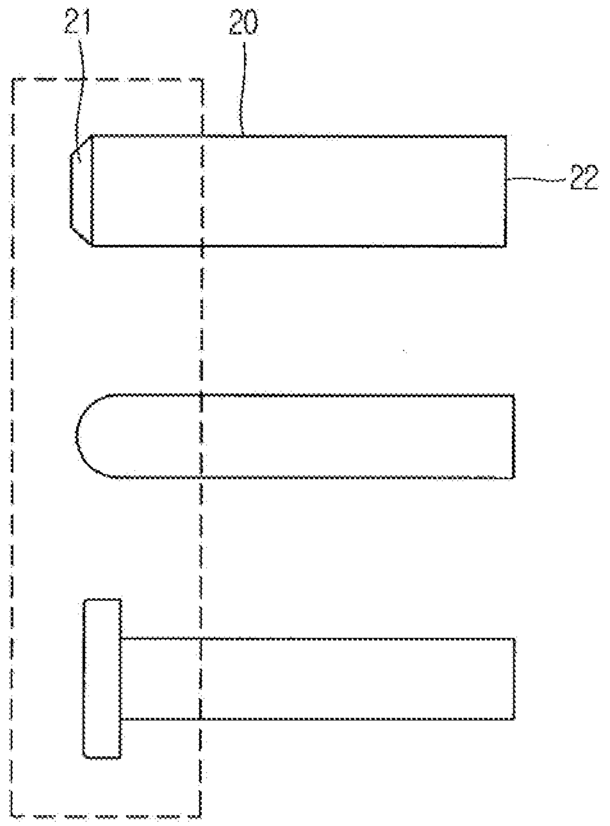
FIGS. 7A and 7B are detailed views of an adjusting screw according to an embodiment of the present invention.
Figure 7B:
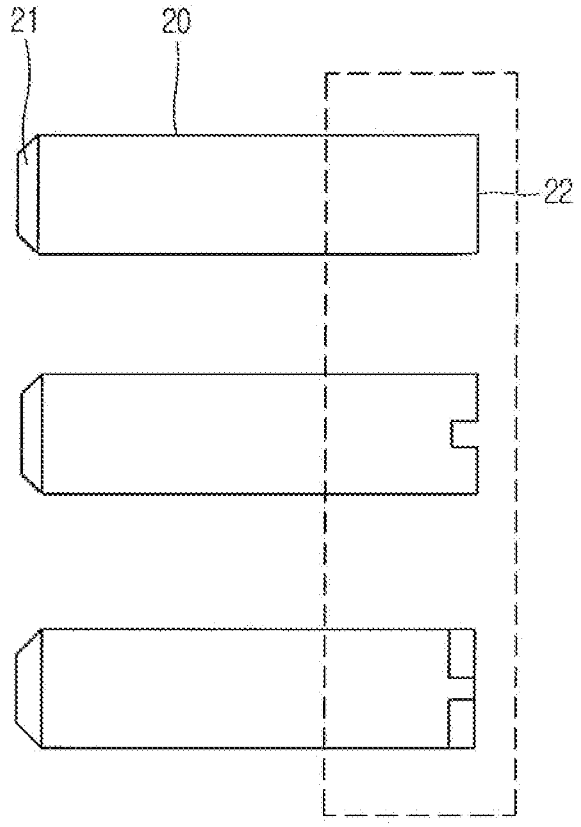
Figure 8:
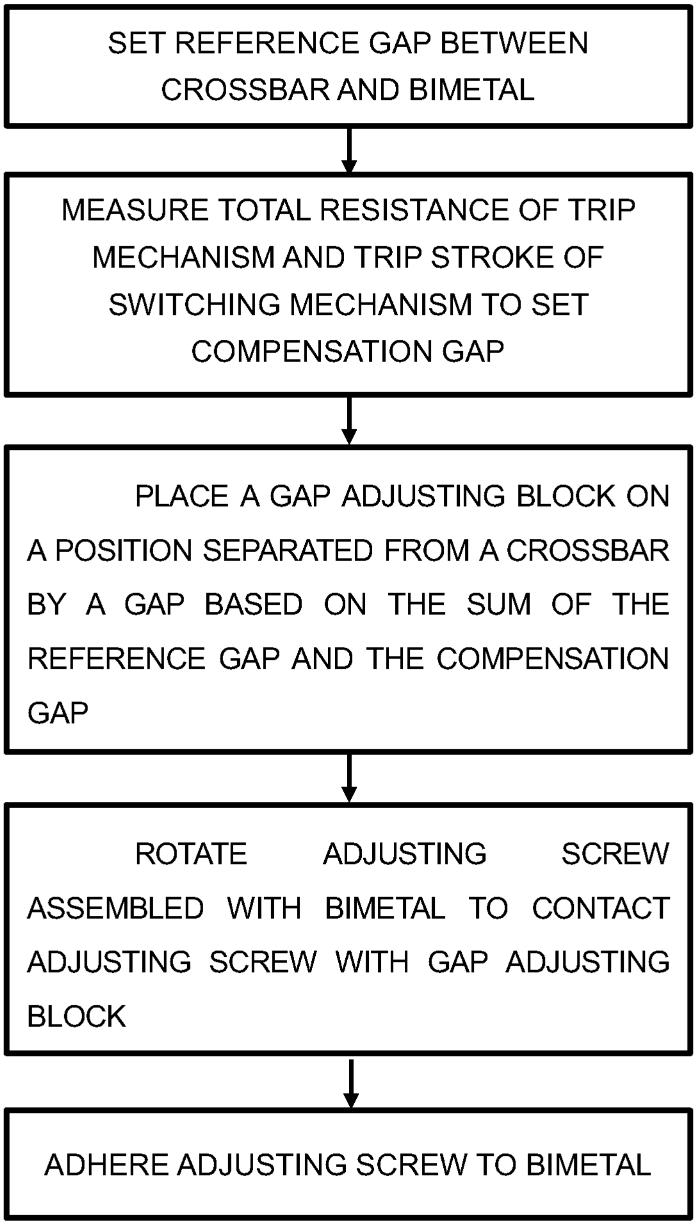
FIG. 8 is a flowchart of a gap adjusting method according to an embodiment of the present invention.
Figure 9:
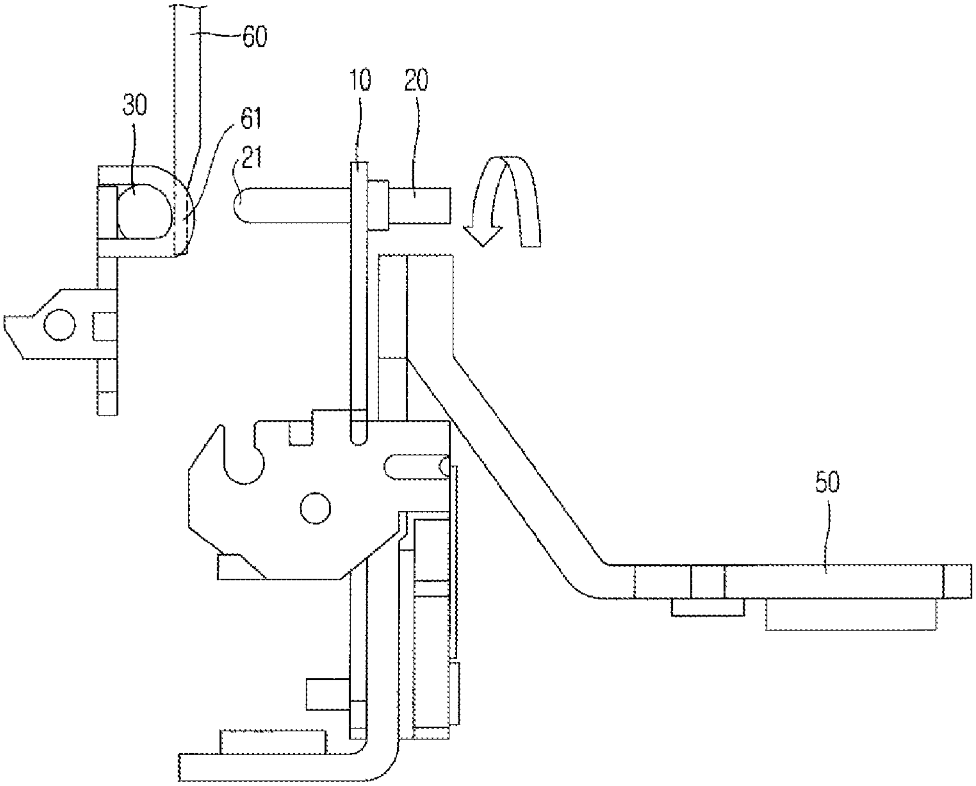
FIG. 9 is a view of a gap adjusting operation according to an embodiment of the present invention.

FIGS. 5A and 5B are partial front view and partial side view of a trip mechanism according to an embodiment of the present invention; FIGS. 6A and 6B are front view and side view of a bimetal according to an embodiment of the present invention; FIGS. 7A and 7B are detailed views of an adjusting screw according to an embodiment of the present invention; FIG. 8 is a flowchart of a gap adjusting method according to an embodiment of the present invention; and FIG. 9 is a view of a gap adjusting operation according to an embodiment of the present invention. Hereinafter, an embodiment of the present invention will be described in detail with reference to the accompanying drawings.

A gap adjusting method in a trip mechanism of a molded case circuit breaker, according to an embodiment of the present invention, includes: setting a reference gap between a crossbar and a bimetal; measuring a total resistance of the trip mechanism and a trip stroke of a switching mechanism to set a compensation gap; placing a gap adjusting block on a position separated from a crossbar by a gap based on the sum of the reference gap and the compensation gap; rotating an adjusting screw assembled with the bimetal to contact the adjusting screw with the gap adjusting block; and adhering the adjusting screw to the bimetal.

A hole 11 may be formed at an upper portion of the bimetal 10, and a tap process may be performed for the hole 11.

An adjusting screw 20 may be coupled to the hole 11 of the bimetal 10. The adjusting screw 20 may rotate to move forward and backward, and a gap between the adjusting screw 10 and a crossbar 30 may be adjusted.

When a fault current is applied to a circuit breaker, a heater 50 generates heat, and the heat is transferred to the bimetal 10 to bend the bimetal 10. At this time, the adjusting screw 20 assembled with the bimetal 10 pushes the crossbar 30 of a switching mechanism to move a nail (not shown), and binding of a latch is released by the nail, whereby a trip of the switching mechanism is performed.

Here, an amount of applied current and a time are changed according to a gap between the crossbar 30 and the adjusting screw 20 coupled to the bimetal 10.

A front end 21 of the adjusting screw 20 is a surface which contacts the crossbar 30. The front end 21 may be formed of a round surface of a planar surface so that a contact surface is not changed despite rotation.

In a rear end 22 of the adjusting screw 20, a straight-shaped or cross-shaped surface may be engraved or embossed so as to enable an angle to be easily adjusted. That is, the rear end 22 of the adjusting screw 20 may be formed of one of a straight-shaped groove, a cross-shaped groove, a straight-shaped projection, and a cross-shaped projection.

The gap between the crossbar 30 and the adjusting screw 20 coupled to the bimetal 10 may be determined based on the sum of a reference gap and a compensation gap.

First, the reference gap between the crossbar 30 and the bimetal 10 may be set. The reference gap may be determined based on a rating for each product.

The compensation gap may be determined by a trip stroke of the switching mechanism and a total resistance of the trip mechanism. Here, the trip stroke denotes a distance from a position of the crossbar 30 in a normal state to a position in which the crossbar 30 rotates and thus the switching mechanism is released. The total resistance of the trip mechanism is measured including the heater 50.

By rotating the adjusting screw 20, the front end 21 of the adjusting screw 20 may be disposed at a position separated from the crossbar 30 by a setting gap. The gap is a gap determined based on the sum of the reference gap and the compensation gap. In this case, this gap may be set by a gap adjusting block 60.

The gap adjusting block 60 may be freely moved in up, down, left, and right directions at a side of a product. The gap adjusting block 60 may be operated by a auxiliary device. The gap adjusting block 60 may be inserted between the crossbar 30 and the adjusting screw 20, and may be separated from the crossbar 30 by the determined gap. Also, the adjusting screw 20 may be automatically rotated to move to a contact surface 61 of the gap adjusting block 60, and thus, the gap can be optimized as a gap suitable for the each product.

An initial position of the gap adjusting block 60 may start from a surface of the crossbar 30. The gap adjusting block 60 may move by the determined gap in a direction of the adjusting screw 20, and deviation, based on a bending amount of the bimetal 10, for each product is included in gap adjustment.

A contact surface 61 of the gap adjusting block 60, which contacts the adjusting screw 20, may be planarly formed. Also, the front end 21 of the adjusting screw 20 may be planarly formed, and the front end 21 of the adjusting screw 20 and the contact surface 61 of the gap adjusting block 60 are not slid and thus do not cause an error of each product.

Moreover, the contact surface 61 of the gap adjusting block 60 may be vertical to a rotation axis of the adjusting screw 20. Therefore, it is easy to adjust a gap between the contact surface 61 of the gap adjusting block 60 and the front end 21 of the adjusting screw 20 by moving the gap adjusting block 60.

Moreover, the gap adjusting block 60 may have a thickness and stiffness which are not modified by an adhering force of the adjusting screw 20. The gap adjusting block 60 is movable in up, down, left, and right directions, and thus may simultaneously adjust a single phase or a plurality of phases of the circuit breaker.

According to the gap adjusting method in the trip mechanism of the molded case circuit breaker, a gap may be set even in a state where a current is not applied (i.e., a trip state of the circuit breaker), and thus, equipment such as a current applying device, a laser welding device, and a cooling device are not needed. Accordingly, the cost for equipment is reduced, and the cost and a time for maintenance are reduced.

Moreover, since a cooling process is not needed, a process is shortened in time, and scattering caused by cooling does not occur.

According to the gap adjusting method in the trip mechanism of the molded case circuit breaker, assembly is easy, and a consistency of quality for each product is enhanced.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A gap adjusting method in a trip mechanism of a molded case circuit breaker, the gap adjusting method comprising:

setting a reference gap between a crossbar and a bimetal;

measuring a total resistance of the trip mechanism and a trip stroke of a switching mechanism to set a compensation gap;

placing a gap adjusting block on a position separated from a crossbar by a gap based on a sum of the reference gap and the compensation gap;

rotating an adjusting screw assembled with the bimetal to contact the adjusting screw with the gap adjusting block; and adhering the adjusting screw to the bimetal.

2. The gap adjusting method of claim 1, wherein a contact surface of the gap adjusting block is planarly formed.

3. The gap adjusting method of claim 1, wherein a contact surface of the gap adjusting block is vertical to a rotation axis of the adjusting screw.

4. The gap adjusting method of claim 1, wherein a front end of the adjusting screw is formed of a round surface of a planar surface.

5. The gap adjusting method of claim 2, wherein a rear end of the adjusting screw is formed of one of a straight-shaped groove, a cross-shaped groove, a straight-shaped projection, and a cross-shaped projection.

* * * * *